United States Patent [19]
Huang et al.

[11] Patent Number: 6,084,304
[45] Date of Patent: *Jul. 4, 2000

[54] STRUCTURE OF METALLIZATION

[75] Inventors: Yimin Huang, Taichung Hsien; Tri-Rung Yew, Hsinchu Hsien, both of Taiwan

[73] Assignee: United Microelectronics Corp., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/100,769

[22] Filed: Jun. 5, 1998

[30] Foreign Application Priority Data

May 1, 1998 [TW] Taiwan ................... 87106762

[51] Int. Cl.$^7$ .................................... H01L 23/485
[52] U.S. Cl. ................. 257/762; 257/758; 257/784; 257/752
[58] Field of Search .................. 257/758, 762, 257/784, 752

[56] References Cited

U.S. PATENT DOCUMENTS

| | | | |
|---|---|---|---|
| 4,005,472 | 1/1977 | Harris et al. | 257/737 |
| 4,843,453 | 6/1989 | Hooper et al. | 257/751 |
| 5,084,412 | 1/1992 | Nakasaki | 438/656 |
| 5,102,829 | 4/1992 | Cohn | 29/837 |
| 5,243,222 | 9/1993 | Harper et al. | 257/774 |
| 5,272,376 | 12/1993 | Ueno | 257/737 |
| 5,804,876 | 9/1998 | Lake et al. | 257/737 |
| 5,917,244 | 6/1999 | Lee et al. | 257/762 |

*Primary Examiner*—John Guay
*Attorney, Agent, or Firm*—J.C. Patents; Jiawei Huang

[57] ABSTRACT

A metallization structure comprises a semiconductor substrate and pre-formed multi-interconnect layer, which include a passivation layer deposited on the top copper layer of the multi-interconnect layer, a pad window, and a non-copper thin conductive film. The non-copper thin conductive film is deposited in the pad window to protect the top copper layer from exposure to the air. The non-copper thin conductive film includes aluminum, tantalum, TaN, TiN, or WN.

11 Claims, 3 Drawing Sheets

6,084,304

STRUCTURE OF METALLIZATION

CROSS-REFERENCE TO RELATED APPLICATION

This application claims the priority benefit of Taiwan application serial no. 87106762, filed May 1, 1998, the full disclosure of which is incorporated herein by reference.

BACKGROUND OF THE INVENTION

1. Field of the Invention

This invention relates to a structure of metallization, and more particularly, to an anti-oxidation structure for the top copper layer.

2. Description of Related Art

As the requirement on the complexity and precision of an integrated circuit design keeps increasing in order to reduce the feature size of a semiconductor device and increase the integration of an integrated circuit, a semiconductor device has to contain more than two metal layers to achieve the fabrication of high-density metal interconnects on a limited surface of a chip. Conventionally, aluminum is used as the material of a metal layer. However, as the design rules of a semiconductor device get finer and higher, the requirements of lower resistivity and higher reliability increase as well. Since copper has better conductivity and reliability than that of aluminum, copper has become a new material used in the metal layers.

FIGS. 1A through 1C are the cross-sectional views showing conventional metallization process. Referring to FIG. 1A, a number of copper interconnects are formed on a provided semiconductor substrate 10, wherein the semiconductor substrate 10 has some pre-formed devices, such as a transistor (not shown). A multi-interconnect layer 12 is used here to represent all formed copper interconnects. A top copper layer 14 is formed on the top of the multi-interconnect layer 12, and is surrounded by insulation layer 13.

Referring next to FIG. 1B, an insulation film 16 is deposited on the top of the top copper layer 14, preferably by a chemical vapor deposition (CVD) process, wherein the insulation film includes SiN or SiON. Then, a passivation layer 18 is formed on top of the insulation film 16, wherein the passivation layer 18 includes borophosphosilicate glass (BPSG), phosphosilicate glass (PSG), spin-on glass (SOG), or other dielectric materials. The preferable method for forming the passivation layer 18 is also a CVD process.

Referring to FIG. 1C, the passivation 18 and the insulation film 16 are patterned and etched through in sequence by a photolithography process and an etching process for forming a pad window 19 to expose the top copper layer 14.

The foregoing fabrication process for a top copper layer 14 tends to manifest an occurrence of oxidation on the copper layer before or during the next welding process for connecting the top copper layer to a bonding pad, because the top copper layer 14 is exposed to the air. The oxidation of copper decreases the conductivity and the reliability of a copper interconnect, and further causes a short that might possibly damage the whole integrated circuit.

SUMMARY OF THE INVENTION

It is therefore an objective of the present invention to provide a metallization process that deposes a thin conductive film on a conventional top copper layer, wherein the thin conductive film is formed by a material different from copper. Because the top copper layer is protected from exposure to the air, the occurrence of oxidation on the top copper layer can be eliminated.

In accordance with the foregoing and other objectives of the present invention, the invention provides a metallization structure including a semiconductor substrate having a number of copper interconnects, a passivation layer, a pad window patterned in the passivation layer, and a conductive film deposited in the pad window. The passivation layer includes PSG or SiN. The conductive film, which is not made of copper, is used to protect the top copper layer from exposure to the air, wherein the conductive film includes aluminum, tantalum, TaN, TiN, or WN.

In accordance with the foregoing and other objectives of the present invention, the invention provides a metallization process including providing a semiconductor substrate having a number of pre-formed copper interconnects, forming a cap insulation film over the top copper layer, and forming a passivation layer on the cap insulation film. The cap insulation film includes SiN or SiON, and the passivation layer includes PSG or SiN. Then, a pad window is formed in the cap insulation film and the passivation layer by a photolithography process and an etching process. Next, a non-copper conductive film is deposited in the pad window and on the passivation layer, wherein the non-copper conductive film includes aluminum, tantalum, TaN, TiN, or WN. Finally, a polishing process is performed to expose the passivation layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
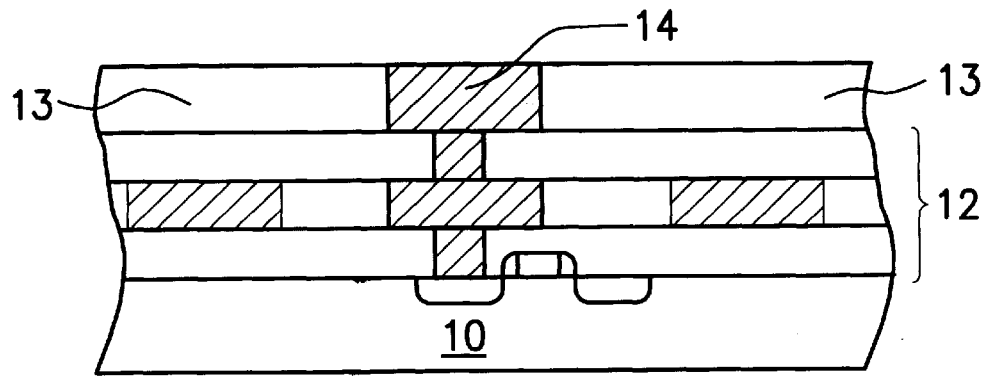
FIGS. 1A through 1C are cross-sectional views showing a conventional metallization process.
Figure 1B:
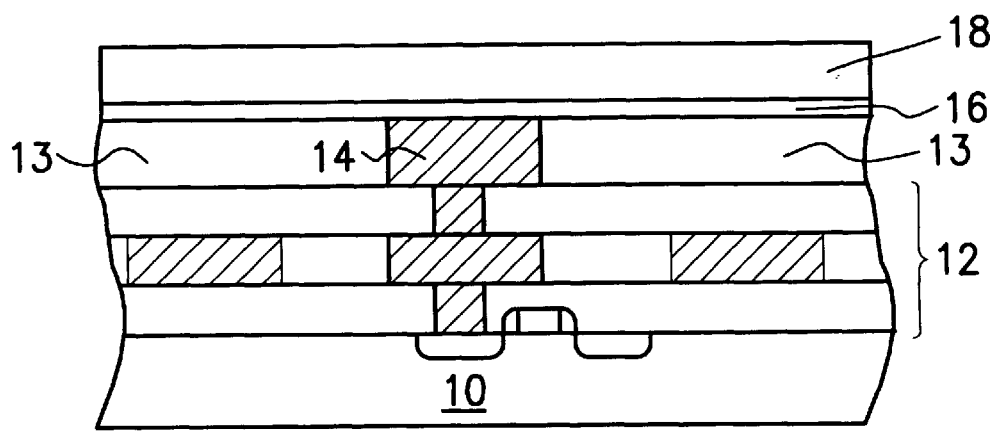
Figure 1C:
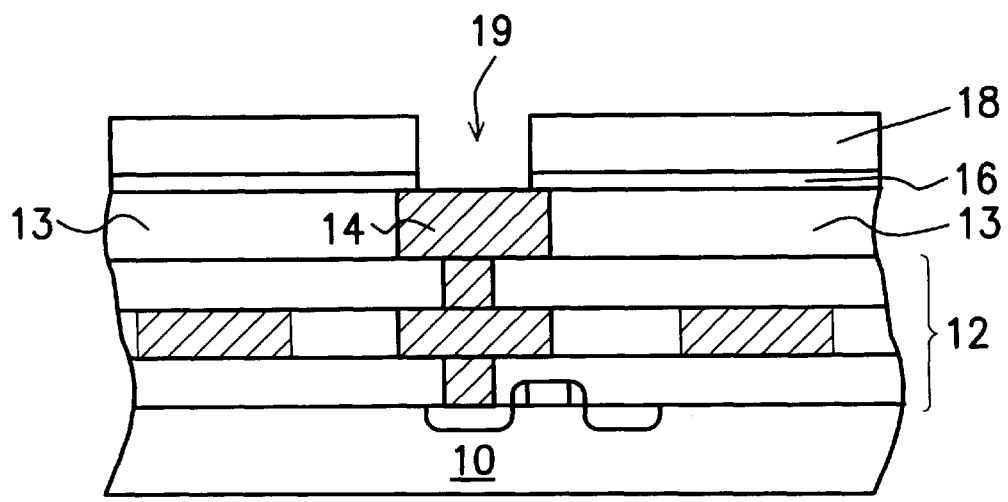
Figure 2A:
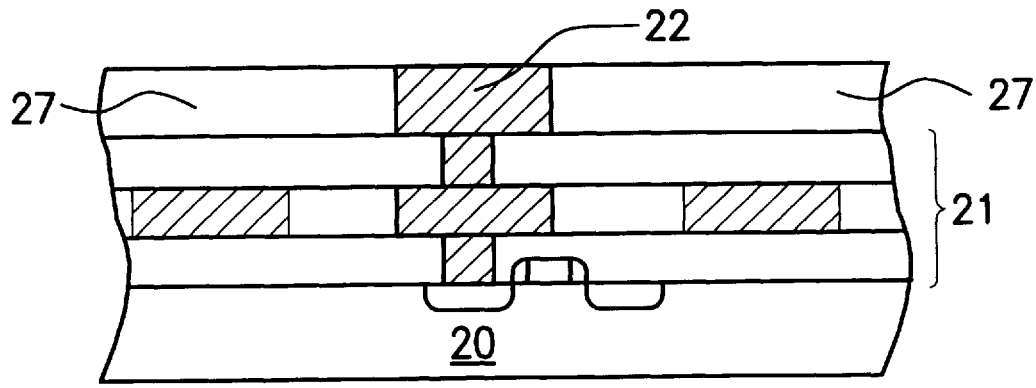
FIGS. 2A through 2E are cross-sectional views showing an anti-oxidation process for the top copper layer in a preferred embodiment according to the invention.

Referring to FIG. 2A, a number of metal interconnects are formed on a provided semiconductor substrate 20, wherein the semiconductor substrate has a number of pre-formed devices including metal layers (not shown) and transistors (not shown). A multi-interconnect layer 21 is used in the diagram to represent the pre-formed metal interconnects. A top copper layer 22, is used to connect to an external bonding pad.

Figure 2B:
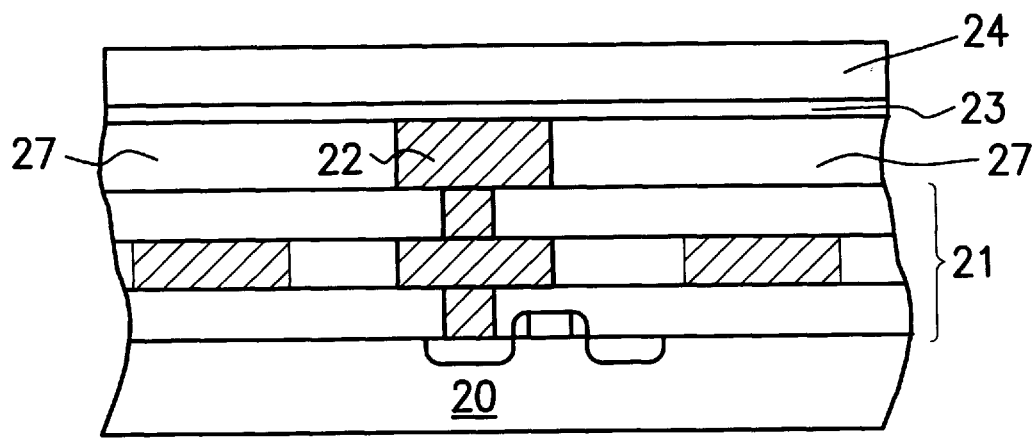

In FIG. 2B, a cap layer 23 is formed on the top copper layer 22. The cap layer 23 includes SiN or SiON. and a preferable process to form the cap layer 23 includes a CVD process. Then, a passivation layer 24 is formed on the cap layer 23. The passivation layer 24 includes BPSG, PSG, SiN, or other dielectric materials, and a preferable method of forming the passivation layer 24 is a CVD process.

Figure 2C:
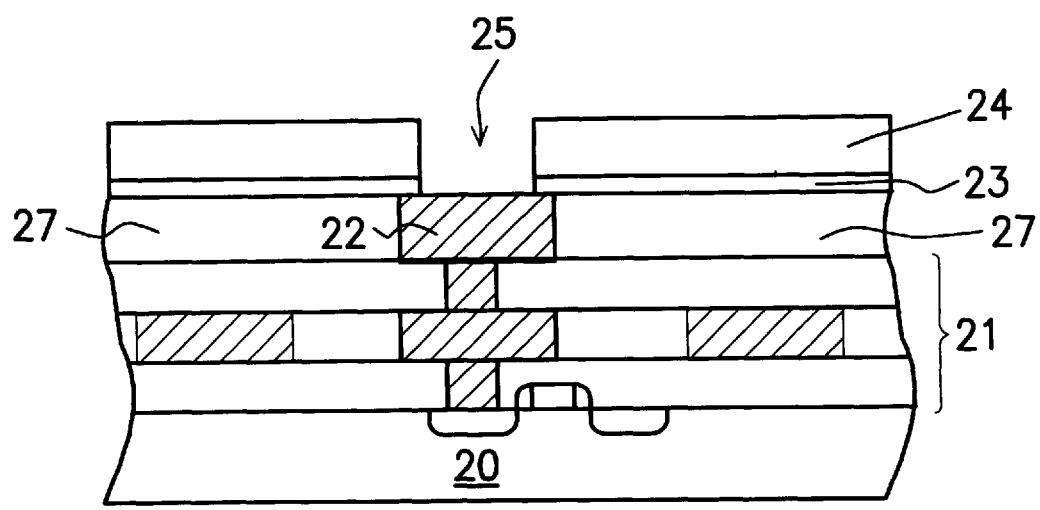

Referring to FIG. 2C, a photolithography process and an etching process are performed to pattern and etch through the passivation layer 24 and the cap layer 23 in sequence to form a pad window 25 to expose the top copper layer 22.

Figure 2D:
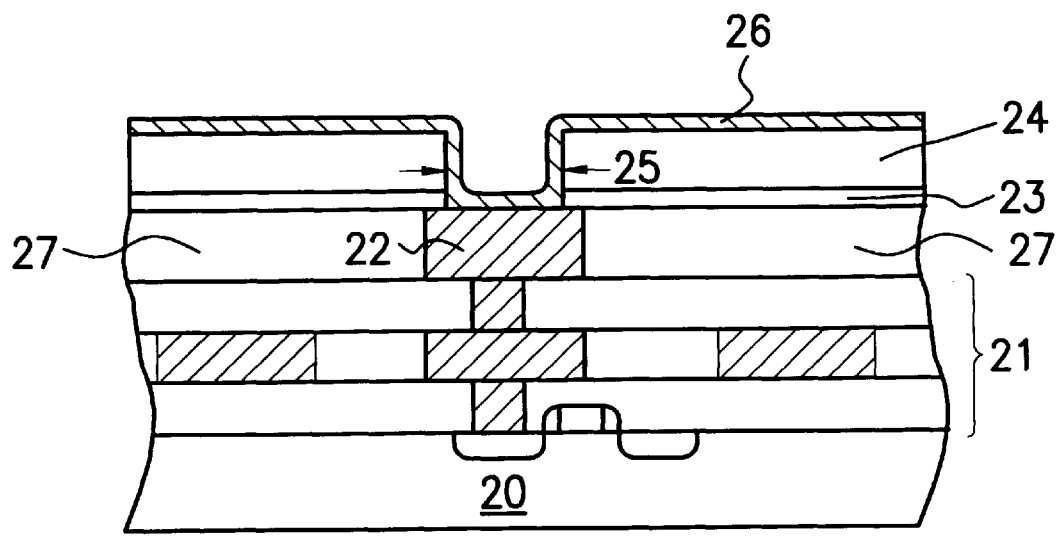

Referring to FIG. 2D, a thin conductive film 26 is deposited on the passivation layer 24 and in the pad window 25, wherein the thin conductive film 26 includes aluminum, tantalum, TaN, TiN, and WN. The thin conductive film 26 is a technical specificity of the invention that protects the top copper layer from exposure to the air. The method for forming the thin conductive film 26 includes a sputtering process or a CVD process.

Figure 2E:
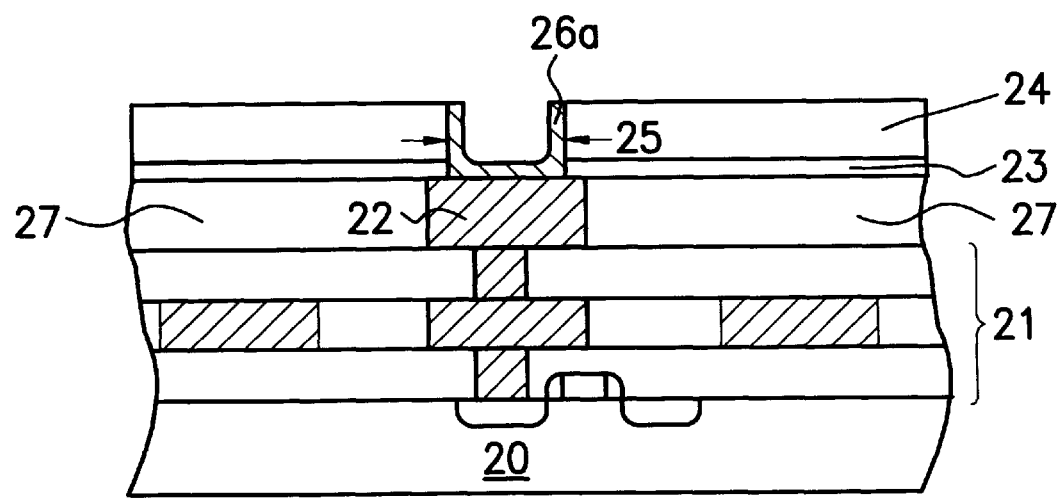

Referring next to FIG. 2E, a chemical mechanical polishing (CMP) process serving as a planarization process is performed to remove a portion of the thin conductive film that cover the passivation layer 24 to expose the passivation layer 24. After the CMP process, the conductive film 26 becomes a conductive film 26a on the inner peripheral surface of the pad window 25.

According to the foregoing, the metallization process and the metallization structure provided by the invention can prevent the top copper layer from oxidation, so that the conductivity remains excellent after the following welding process, and the stability of device is improved. The process of the invention can be accomplished by existing techniques, so no extra machines are required.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A metallization structure, comprising:

a semiconductor substrate, having a multi-interconnect layer;

a top copper layer, deposited on the multi-interconnect layer;

a passivation layer, deposited on the top copper layer, wherein a pad window is formed in the passivation layer to expose a portion of the top copper layer; and a conductive film, only formed on, and substantially fully covering an inner peripheral surface of the pad window including a vertical sidewall and a portion of the top copper layer exposed by the pad window, wherein the conductive film is used to protect the top copper layer from exposure to air, and includes a material other than copper, wherein the conductive film results from a preliminary conductive film which covers over the passivation layer and the inner peripheral surface of the pad window, and a portion of the preliminary conductive layer above the passivation layer is removed by a chemical mechanical polish (CMP) technology.

2. The structure of claim 1, which further includes an insulation film deposited between the passivation layer and the top copper layer.

3. The structure of claim 2, wherein the insulation film includes SiN.

4. The structure of claim 2, wherein the insulation film includes SiON.

5. The structure of claim 1, wherein the passivation layer includes phosphosilicate glass.

6. The structure of claim 1, wherein the passivation layer includes SiN.

7. The structure of claim 1, wherein the conductive film includes aluminum.

8. The structure of claim 1, wherein the conductive film includes tantalum.

9. The structure of claim 1, wherein the conductive film includes TaN.

10. The structure of claim 1, wherein the conductive film includes TiN.

11. The structure of claim 1, wherein the conductive film includes WN.

* * * * *